US008248126B2

(12) United States Patent
Jang et al.

(10) Patent No.: US 8,248,126 B2
(45) Date of Patent: Aug. 21, 2012

(54) CLOCK CONTROL CIRCUIT AND DATA ALIGNMENT CIRCUIT INCLUDING THE SAME (75) Inventors: Ji-Eun Jang, Kyoungki-do (KR); Seok-Cheol Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1270 days.

(21) Appl. No.: 12/006,113

(22) Filed: Dec. 31, 2007

(65) Prior Publication Data

US 2009/0115480 A1 May 7, 2009

(30) Foreign Application Priority Data

Nov. 2, 2007 (KR) .......................... 10-2007-0111342

(51) Int. Cl.
*H03K 3/017* (2006.01)
*H03K 5/04* (2006.01)
*H03K 7/08* (2006.01)
(52) U.S. Cl. ........................ 327/172; 327/175; 327/176
(58) Field of Classification Search .................. 327/172, 327/175, 176
See application file for complete search history.

(56) References Cited

U.S. PATENT DOCUMENTS

| 5,124,572 | A | 6/1992 | Mason et al. |
| 7,071,755 | B2 | 7/2006 | Saeki |
| 7,279,946 | B2 * | 10/2007 | Minzoni ....................... 327/158 |
| 7,284,145 | B2 | 10/2007 | Kawabata |
| 2004/0218460 | A1 | 11/2004 | Lee |

FOREIGN PATENT DOCUMENTS

| KR | 1020040093858 | 11/2004 |
| TW | 454387 | 9/2001 |
| TW | 541799 | 7/2003 |
| TW | 1271036 | 1/2007 |

* cited by examiner

*Primary Examiner* — John Poos
(74) *Attorney, Agent, or Firm* — Blakely, Sokoloff, Taylor & Zafman (57) ABSTRACT A clock control circuit can prevent a malfunction that occurs when a rising strobe signal and a falling strobe signal change in pulse width and thus overlap each other. The clock control circuit which includes a first clock control unit configured to receive a rising strobe signal and a falling strobe signal and output an adjusted rising strobe signal, an enable pulse width of which does not overlap an enable pulse width of the falling strobe signal.

17 Claims, 6 Drawing Sheets

CLOCK CONTROL CIRCUIT AND DATA ALIGNMENT CIRCUIT INCLUDING THE SAME

CROSS-REFERENCE TO RELATED APPLICATIONS

The present invention claims priority to Korean patent application number 10-2007-0111342, filed on Nov. 2, 2007, which is incorporated by reference in its entirety.

BACKGROUND OF THE INVENTION

The present invention relates to a clock control circuit for controlling a clock such as a data strobe signal, and a data alignment circuit including the same; and, more particularly, to a clock control circuit capable of preventing overlap between a rising strobe signal and a falling strobe signal, and a data alignment circuit including the same.

A semiconductor memory device has been continuously developed to increase integration density and improve an operating speed thereof. To improve the operating speed, a synchronous semiconductor memory device has emerged, which is operable in synchronization with an external clock.

A single data rate (SDR) synchronous semiconductor memory device which inputs or outputs one data via one data pin in synchronization with a rising edge of an external clock during one clock cycle has been proposed and developed. However, the SDR synchronous semiconductor memory device is insufficient to satisfy the speed requirement of a high-speed system. Thus, a double data rate (DDR) synchronous semiconductor memory device was proposed which processes two data during one clock cycle.

In the DDR synchronous semiconductor memory device, two data are consecutively input or output through data input/output pins in synchronization with rising and falling edges of the external clock. The DDR synchronous semiconductor memory device can realize at least two times the bandwidth of the SDR synchronous semiconductor memory device without increasing the frequency of the clock, thus obtaining the high-speed operation.

Because the DDR synchronous semiconductor memory device must output or receive two data during one clock cycle, a data access method employed in the conventional synchronous semiconductor memory device can no longer be used.

If the clock period is about 10 ns, two consecutive data must be processed substantially within about 6 ns, except for the rising and falling time, e.g., about 2 ns (=0.5×4) and time required for meeting other specifications. However, it is difficult for the semiconductor memory device to process two data within that time. Therefore, the semiconductor memory device operates in synchronization with the rising and falling edges of the clock only when receiving/outputting data from/to an external circuit. Substantially, inside the semiconductor memory device, the two data are processed in parallel in synchronization with one edge of the clock.

Thus, a new data access method is necessary in order for a semiconductor memory device to transfer received data to an inner core region or to output data from the core region to an external circuit.

Consequently, a data input buffer of the DDR synchronous semiconductor memory device prefetches 2-bit data in synchronization with rising and falling edges of the clock, and then, transfers the prefetched data to an inner core region as even-bit data or odd-bit data in synchronization with a rising edge of a main clock.

As a semiconductor device such as a central processing unit (CPU) operates at a higher speed, semiconductor memory devices are required to also operate at a higher speed. To meet this requirement, a data alignment circuit is being used. The data alignment circuit prefetches 4-bit data in the case of a DDR2 synchronous semiconductor memory device or 8-bit data in the case of a DDR3 synchronous semiconductor memory device, and transfers the data to an internal region of the semiconductor memory device.

Meanwhile, in order to implement accurate timing in data input/output, a data strobe signal DQS for noting data transfer are input to the semiconductor memory device with a corresponding data from an external device such as a CPU or a memory controller.

Figure 1:
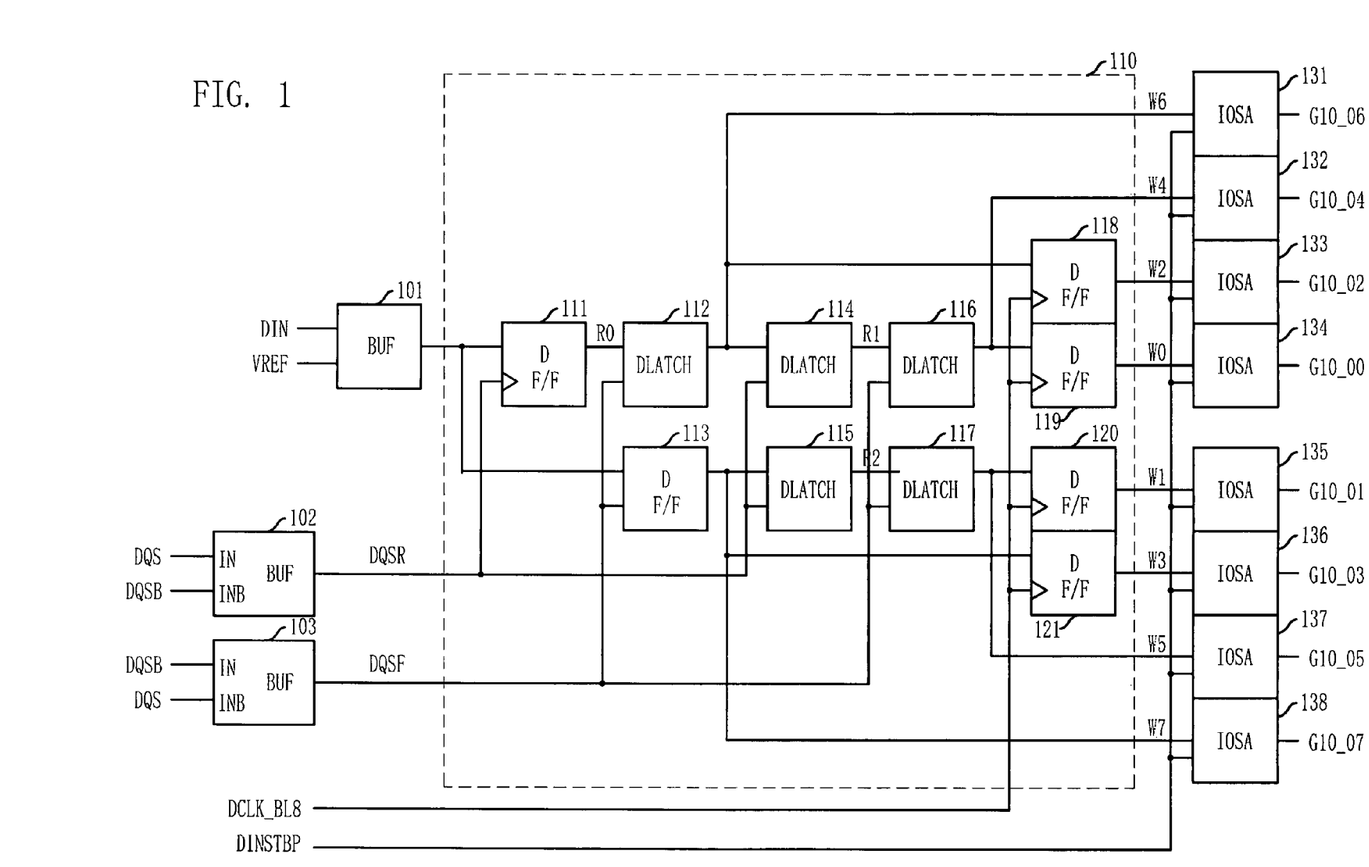
FIG. 1 is a block diagram of a data alignment circuit used in a conventional semiconductor memory device.

FIG. 1 is a block diagram of a data alignment circuit used in a conventional semiconductor memory device.

Referring to FIG. 1, a data alignment circuit 110 performs 8-bit prefetch. The data alignment circuit 110 receives data DIN and data strobe signals DQS and DQSB via buffers 101, 102 and 103. The data DIN are input in series, and the data alignment circuit 110 aligns the data DIN in parallel W0 to W7 by using data strobe signals DQS and DQSB. As shown, the data alignment circuit 110 includes D flip-flops 111, 113, 118, 119, 120 and 121 and D-latches 112, 114, 115, 116 and 117.

A data input buffer 101 buffers the data DIN, and compares a voltage level of the data DIN with a voltage level of a reference voltage (VREF) to determine whether the data DIN is a logic high data or a logic low data.

A strobe buffers 102 and 103 receive a data strobe signal DQS and a data strobe bar signal DQSB, but through opposite input terminals to each other. Then, the strobe buffer 102 outputs a rising strobe signal DQSR that is enabled during a high level duration of the data strobe signal DQS. The strobe buffer 103 outputs a falling strobe signal DQSF that is enabled during a low level duration of the data strobe signal DQS.

The D flip-flops 111 and 113 and the D-latches 112, 114, 115, 116 and 117 in the data alignment circuit 110 align the serial data in parallel W0 to W7 by using the rising strobe signal DQSR and the falling strobe signal DQSF. The data W0 to W7 aligned in parallel are written to global input/output (I/O) lines GIO_00 to GIO_07 by I/O sense amplifiers 131 to 138.

Figure 2:
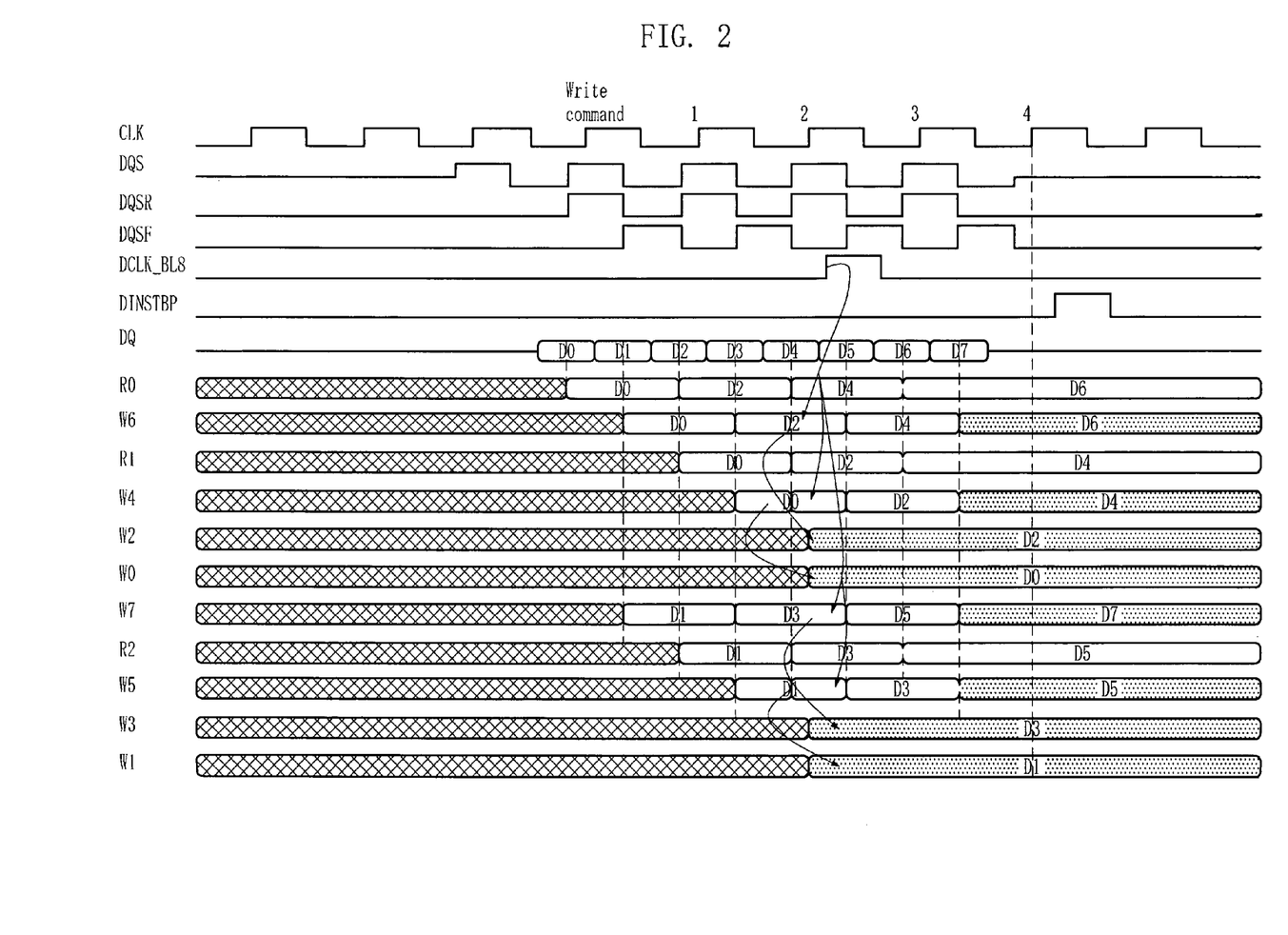
FIG. 2 is a timing diagram illustrating an operation of a data alignment circuit.

FIG. 2 is a timing view illustrating an operation of the data alignment circuit 110. The operation of the data alignment circuit will now be described with reference to FIGS. 1 and 2.

In a write operation of 8-bit prefetch, eight serial data D0 to D7 are aligned in parallel, thereby simultaneously writing the eight data D0 to D7 at a clock next to the input of the last data bit D7.

The data D0, D2, D4 and D6 centered on the rising edge of a data strobe signal DQS are aligned using a rising strobe signal DQSR. Hereinafter, the data D0, D2, D4 and D6 are referred to as rising data. The data D1, D3, D5 and D7 centered on the falling edge of the data strobe signal DQS are aligned using a falling strobe signal DQSF. Hereinafter, the data D1, D3, D5 and D7 are referred to as falling data. The process of aligning the rising data D0, D2, D4 and D6 input at the rising edge and the process of aligning the falling data D1, D3, D5 and D7 input at the falling edge are independently performed in the same basic operating manner. Thus, for explanation of the operation of the data alignment circuit, the process of aligning the rising data D0, D2, D4 and D6 will be described.

First, data DIN are input in series to the D flip-flop 111 via the data input buffer 101. The rising data D0 of the data DIN is applied on an R0 line at the rising edge of the rising strobe signal DQSR. When the falling strobe signal DQSF is 'HIGH', the data D0 on the R0 line is applied on a W6 line by the D-latch 112. Then, the data D0 on the W6 line is shifted by half the clock cycle to be applied on an R1 line by the D-latch 114, and shifted again by half the clock cycle to be applied on a W4 line by the D-latch 116. Meanwhile, a signal DCLK_BL8 including burst length information is enabled after two clocks since the data input point. The data D0 on the W4 line is applied on a W0 line by the D flip-flop 119 by using the DCLK_BL8 signal. The rising data D2 is applied on the R0 line at the rising edge of the rising strobe signal DQSR. When the falling strobe signal DQSF is 'HIGH', the data D2 on the R0 line is latched and applied on the W6 line by the D-latch 112. Thereafter, the data D2 on the W6 line is latched and applied on a W2 line by the D flip-flop 118 by using the DCLK_BL8 signal. The rising data D4 is applied on the R0 line at the rising edge of the rising strobe signal DQSR. When the falling strobe signal DQSF is 'HIGH', the data D4 on the R0 line is latched and applied on the W6 line by the D-latch 112. Then, the data D4 on the W6 line is shifted by half the clock cycle to be applied on the R1 line by the D-latch 114 and shifted again by half the clock cycle to be applied on the W4 line by the D-latch 116. The rising data D6 is applied on the R0 line at the rising edge of the rising strobe signal DQSR. When the falling strobe signal DQSF is 'HIGH', the data D6 on the R0 line is latched and applied on the W6 line by the D-latch 112. In such a manner, the D0, D2, D4 and D6 are respectively applied on the W0, W2, W4 and W6 lines. Thereafter, the data D0, D2, D4 and D6 on the W0, W2, W4 and W6 are simultaneously written to the global I/O lines GIO-00, GIO-02, GIO_04 and GIO_06 by a signal DINSTBP that is enabled after four clocks since the data input point, respectively.

The data D1, D3, D5 and D7 input, centered on the respective falling edges of the data strobe signal DQS are aligned in the same manner as that of aligning the data D0, D2, D4 and D6 centered on the rising edges. This is illustrated in FIG. 2 in detail, and the detailed description thereof will be omitted.

Figure 3:
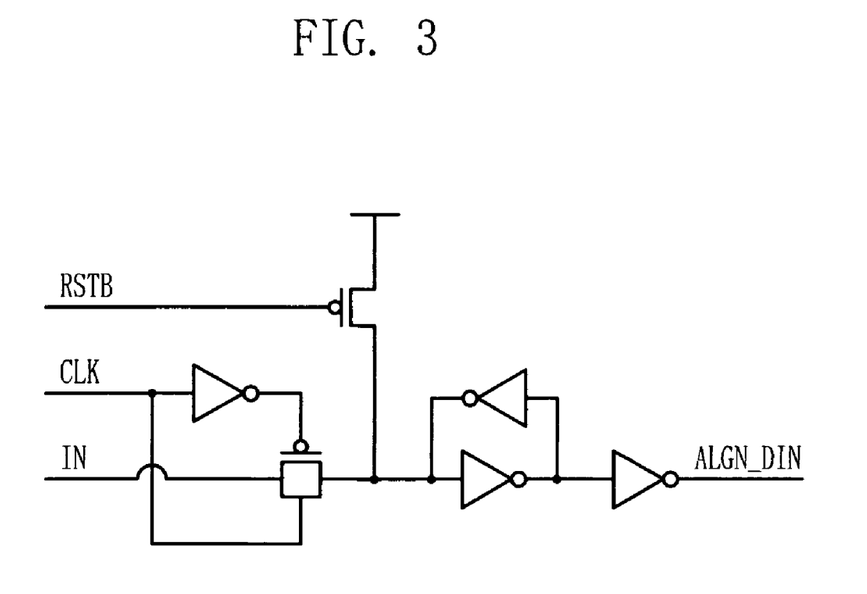
FIG. 3 is a circuit diagram of a D-latch illustrated in FIG. 1.

FIG. 3 is a circuit diagram of a D-latch illustrated in FIG. 1. Referring to FIG. 3, the D-latch includes a pass gate and an inverter latch. It can be seen from FIG. 3 that when a signal being input to a clock terminal CLK is 'HIGH', the D-latch latches data input to an input terminal IN. The signal being input to the clock terminal CLK is a rising strobe signal DQSR or a falling strobe signal DQSF according to the D-latch.

The rising strobe signal DQSR and the falling strobe signal DQSF each have a pulse width corresponding to half the clock cycle, i.e., ½×tCK. However, the pulse widths of the rising strobe signal DQSR and the falling strobe signal DQSF may increase as the signals pass through a gate or because of a variety of factors of a circuit. In this case, the D-lath including the pass gate and the inverter latch cannot accurately shift data.

Figure 4:
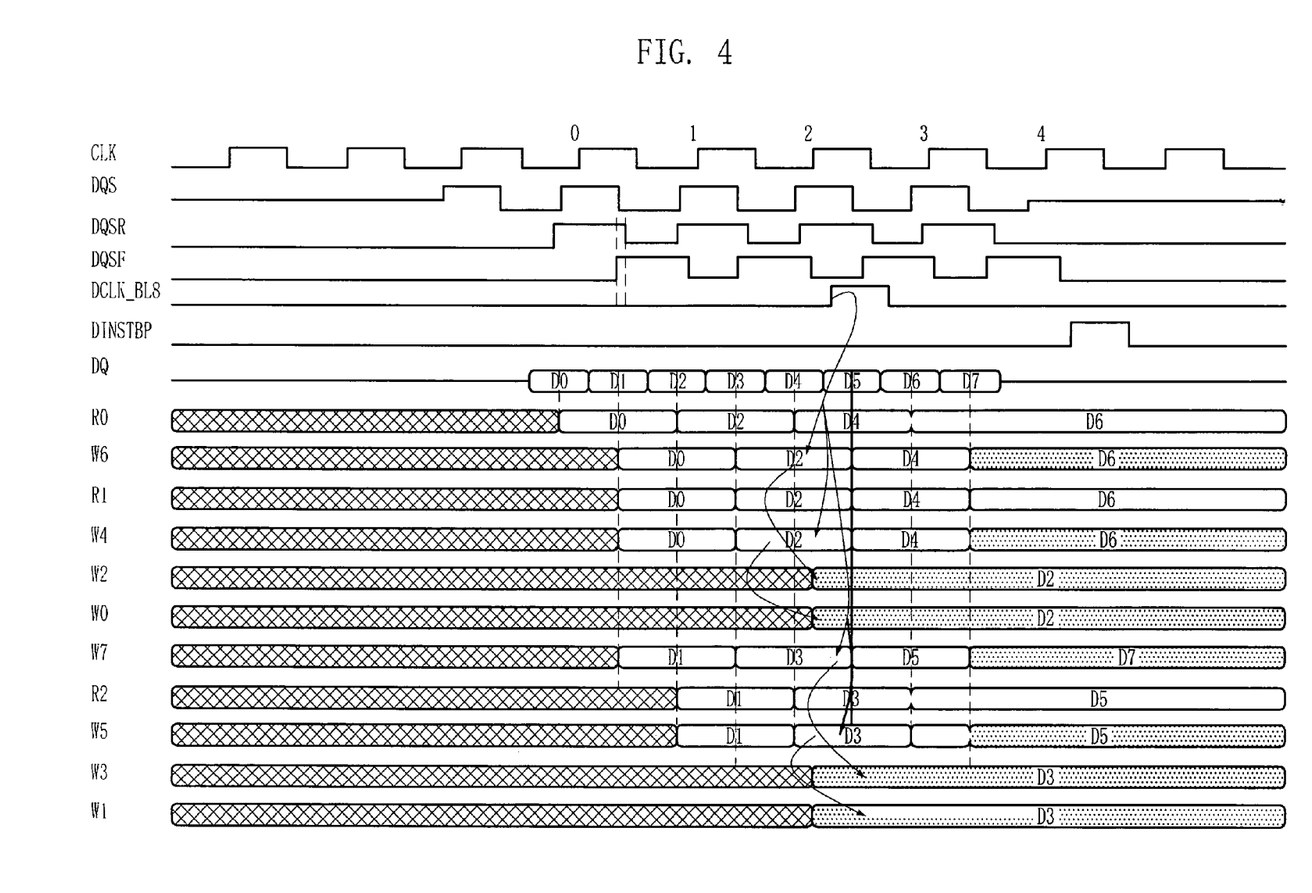
FIG. 4 is a timing diagram for explaining a limitation caused by an increase in pulse width of a rising strobe signal and a falling strobe signal.

FIG. 4 is a timing diagram for explaining a limitation caused by an increase in pulse width of a rising strobe signal DQSR and a falling strobe signal DQSF.

Referring to FIG. 4, a pulse of the rising strobe signal DQSR overlaps a pulse of the falling strobe signal DQSF, causing the D-lath to fail to accurately shift data. Finally, the data are misaligned with respect to the terminals W1 to W7.

The data must be aligned as follows: D0=W0, D1=W1, D2=W2, D3=W3, D4=W4, D5=W5, D6=W6, and D7=W7. However, as shown in FIG. 4, the data are misaligned as D6=W4, D2=W0 and D3=W1. Consequently, data cannot be accurately written to a semiconductor memory device, causing a fail in a write operation of the semiconductor memory device.

SUMMARY OF THE INVENTION

An embodiment of the present invention is directed to providing a clock control circuit, which can prevent a malfunction that occurs when a rising strobe signal and a falling strobe signal change in pulse width and thus overlap each other.

In accordance with an aspect of the present invention, there is provided a clock control circuit which includes a first clock control unit configured to receive a rising strobe signal and a falling strobe signal and output an adjusted rising strobe signal, an enable pulse width of which does not overlap an enable pulse width of the falling strobe signal.

In accordance with another aspect of the present invention, there is provided a clock control circuit which includes a clock control unit configured to receive a rising strobe signal and a falling strobe signal and output an adjusted falling strobe signal, an enable pulse width of which does not overlap an enable pulse width of the rising strobe signal.

In accordance with a third aspect of the present invention, there is provided a data alignment circuit which includes a clock control circuit configured to receive a rising strobe signal and a falling strobe signal, and output an adjusted rising strobe signal and an adjusted falling strobe signal respectively having the same logical values as the rising strobe signal and the falling strobe signal by controlling such that enable pulse widths of the adjusted rising strobe signal and the adjusted falling strobe signal do not overlap each other, and a data alignment unit configured to receive data in series and align the data in parallel and in synchronization with the adjusted rising strobe signal and the adjusted falling strobe signal.

In accordance with a fourth aspect of the present invention, there is provided a clock control circuit which includes a first clock control unit configured to receive a first clock and a second clock serving as a reference clock for a predetermined operation and output an adjusted first clock, an enable pulse width of which does not overlap an enable pulse width of the second clock.

DESCRIPTION OF SPECIFIC EMBODIMENTS

Hereinafter, a clock control circuit and a data alignment circuit including the same in accordance with the present invention will be described in detail with reference to the accompanying drawings.

Figure 5:
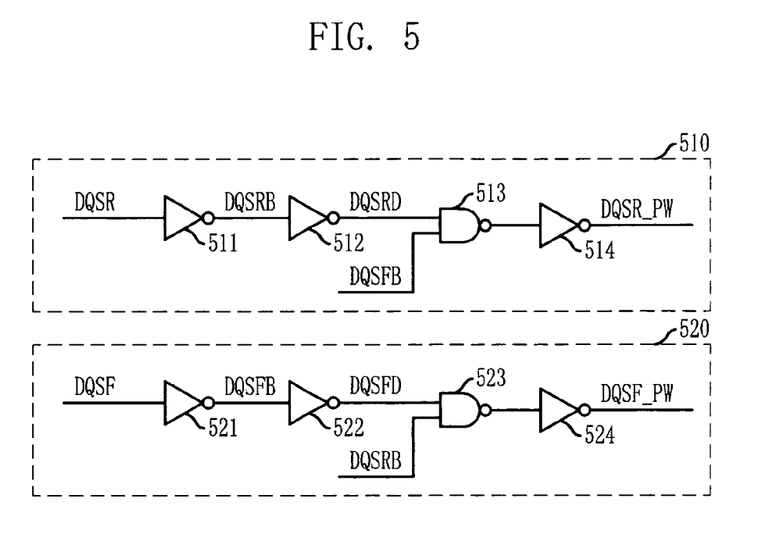
FIG. 5 is a circuit diagram of a clock control circuit in accordance with an embodiment of the present invention.

FIG. 5 is a circuit diagram of a clock control circuit in accordance with an embodiment of the present invention.

Referring to FIG. 5, the clock control circuit in accordance with an embodiment of the present invention includes a first clock control unit 510 and a second clock control unit 520. The first clock control unit 510 receives a rising strobe signal DQSR and a falling strobe signal DQSF. The received falling strobe signal DQSF is a falling strobe bar signal DQSFB. The first clock control unit 510 controls such that an enable pulse width of the rising strobe signal DQSR does not overlap an enable pulse width of the falling strobe signal DQSF, and thus outputs an adjusted rising strobe signal DQSR_PW. The second clock control unit 520 receives a rising strobe signal DQSR and a falling strobe signal DQSF. The received rising strobe signal DQSR is a rising strobe bar signal DQSRB. The second clock control unit 520 controls such that an enable pulse width of the falling strobe signal DQSF does not overlap an enable pulse width of the rising strobe signal DQSR, and thus outputs an adjusted falling strobe signal DQSF_PW.

More specifically, the clock control circuit in accordance with an embodiment of the present invention includes the first clock control unit 510 controlling a pulse width of the rising strobe signal DQSR, and the second clock control unit 520 controlling a pulse width of the falling strobe signal DQSF. The first clock control unit 510 and the second clock control unit 520 serve to prevent respective pulse widths of the rising strobe signal DQSR and the falling strobe signal DQSF from overlapping each other. Even if only one of the first clock control unit 510 and the second clock control unit 520 is used, the enable pulse widths of the rising strobe signal DQSR and the falling strobe signal DQSF do not overlap each other. TO ensure a sufficient margin between the rising strobe signal DQSR and the falling strobe signal DQSF, both the first clock control unit 510 and the second clock control unit 520 may be used. If the margin is not important, just one of the first clock control unit 510 and the second clock control unit 520 may be used.

When the rising strobe signal DQSR is enabled and the falling strobe signal DQSF is disabled, the first clock control unit 510 enables the adjusted rising strobe signal DQSR_PW. The first clock control unit 510 includes a first inverter 511, a second inverter 512, a first NAND gate 513 and a third inverter 514. The first inverter 511 inverts a rising strobe signal DQSR. The second inverter 512 inverts an output DQSRB of the first inverter 511. The first NAND gate 513 performs a NAND operation on a falling strobe bar signal DQSFB and an output DQSRD of the second inverter 512. The third inverter 514 inverts an output signal of the first NAND gate 513 to output an adjusted rising strobe signal DQSR_PW.

The first NAND gate 513 receives the delayed rising strobe signal DQSRD via the two inverters 511 and the 512 without directly receiving the rising strobe signal DQSR. Thus, slightly more margin can be ensured in preventing the pulse widths from overlapping each other. It can be freely determined whether or not the signal passes through the inverters 511 and 512 depending on designs.

When a falling strobe signal DQSF is enabled and a rising strobe signal DQSR is disabled, the second clock control unit 520 enables an adjusted falling strobe signal DQSF_PW. The second clock control unit 520 includes a fourth inverter 521, a fifth inverter 522, a second NAND gate 523, and a sixth inverter 524. The fourth inverter 521 inverts a falling strobe signal DQSF. The fifth inverter 522 inverts an output DQSFB of the fourth inverter 521. The second NAND gate 523 performs a NAND operation on the output DQSRB of the first inverter 511 and an output DQSFD of the fifth inverter 522. The sixth inverter 524 inverts an output signal of the second NAND gate 523, and outputs an adjusted falling strobe signal DQSF_PW.

The second NAND gate 523 receives the delayed falling strobe signal DQSFD via the two inverters 521 and the 522 without directly receiving the falling strobe signal DQSF. Thus, slightly more margin can be ensured in preventing the pulse widths from overlapping each other. It can be freely determined whether or not the signal passes through the inverters 521 and 522 depending on designs.

Figure 6:
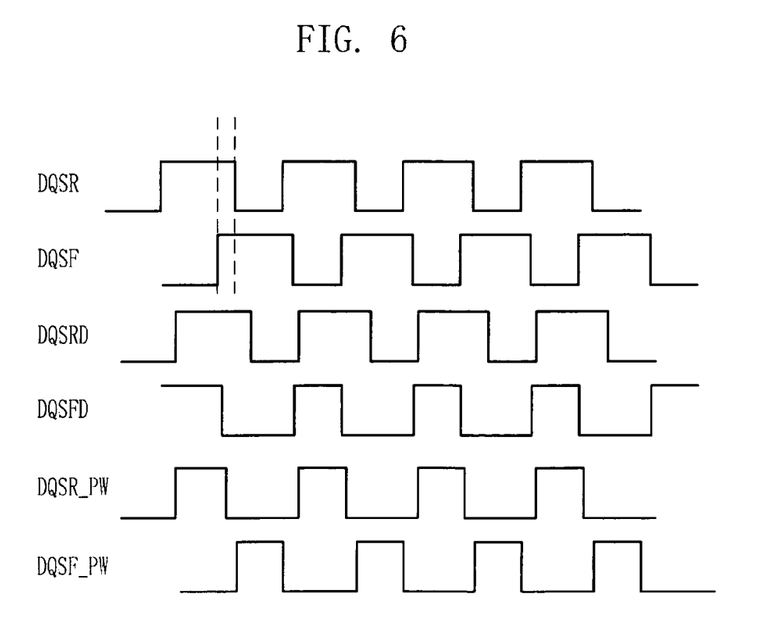
FIG. 6 is a timing diagram of node signals of the clock control circuit illustrated in FIG. 5.

FIG. 6 is a timing diagram of node signals of the clock control circuit illustrated in FIG. 5. An operation of the clock control circuit will now be described with reference to FIG. 6.

Referring to FIG. 6, a rising strobe signal DQSR and a falling strobe signal DQSF are input with their enable pulse widths overlapping each other.

However, the first clock control unit 510 and the second clock control unit 520 control the pulse widths so that an adjusted rising strobe signal DQSR_PW and an adjusted falling strobe signal DQSF_PW output through the clock control circuit are not enabled simultaneously.

In FIG. 5, the clock control circuit controls respective pulse widths of the rising strobe signal DQSR and the falling strobe signal DQSF, which are data strobe signals DQS. However, the use of the clock control circuit in accordance with an embodiment of the present invention is not limited to preventing the overlap between the rising strobe signal DQSR and the falling strobe signal DQSF.

The rising strobe signal DQSR and the falling strobe signal DQSF serve as a kind of a clock that is used as a reference in data alignment. Thus, the clock control circuit in accordance with an embodiment of the present invention may be used for a circuit that uses a first clock and a second clock serving as a reference of a predetermined operation. In this case, the clock control circuit in accordance with an embodiment of the present invention serves as a circuit for preventing enable pulse widths of a first clock and a second clock from overlapping each other.

For example, a semiconductor memory device uses an external clock CLK and a bar clock CLKB as a reference of a predetermined operation performed therein. However, if a specific internal factor causes overlap between enable pulse widths of the clocks CLK and CLKB that should be enabled at different timings, a defect may occur in a specific operation. In this case, the clock control circuit in accordance with an embodiment of the present invention can be used to prevent the overlap between the enable pulse widths of the two clocks CLK and the CLKB.

Even when the clock control circuit in accordance with an embodiment of the present invention is used to prevent the overlap between the enable pulse widths of a first clock, e.g., CLK and a second clock, e.g., CLKB serving as a reference of a predetermined operation, the clock control circuit may have the same configuration as illustrated in FIG. 5, except that a first clock and a second clock are input instead of the rising strobe signal DQSR and the falling strobe signal DQSF to output adjusted first clock and second clock. The further description thereof will be omitted.

Figure 7:
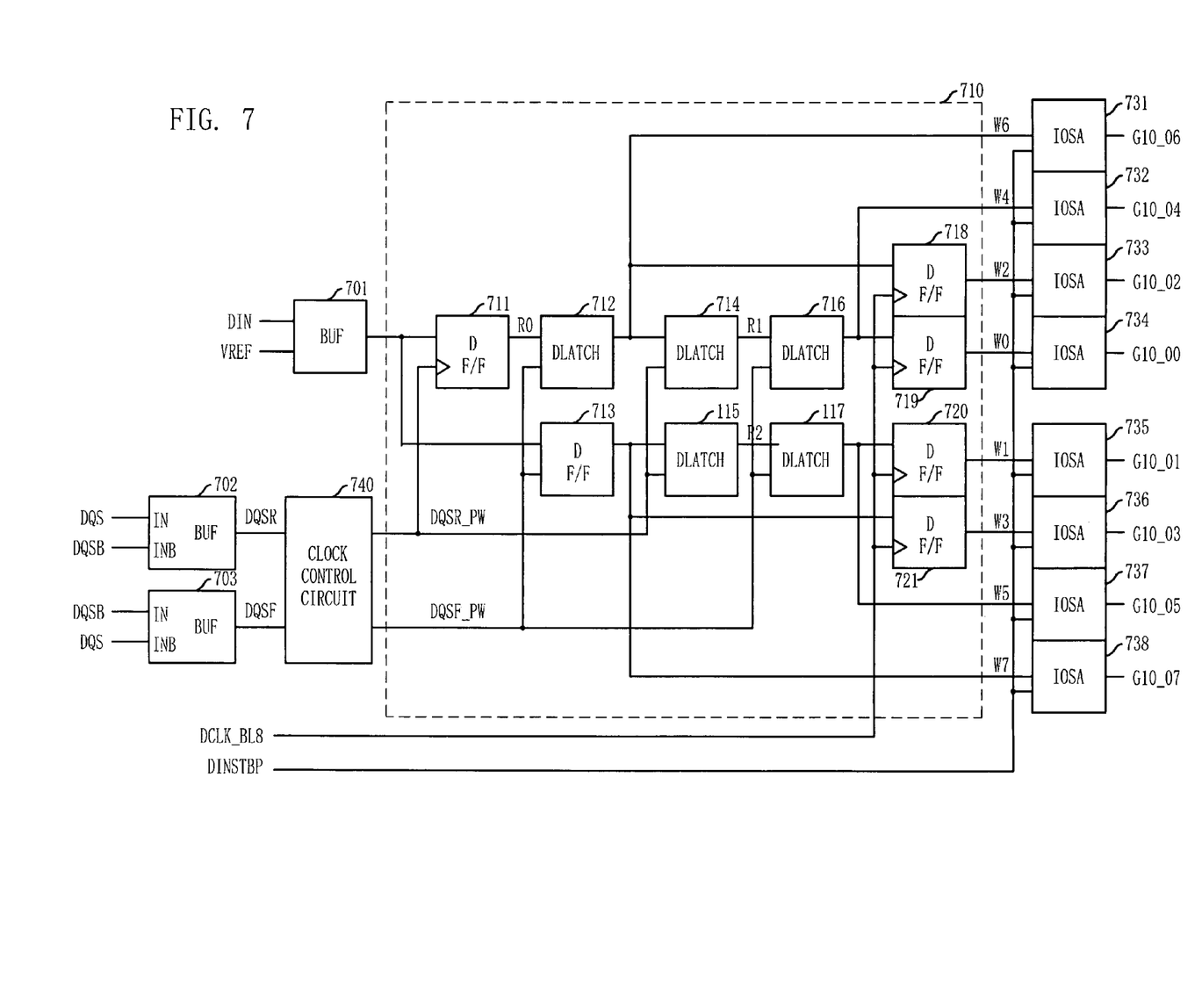
FIG. 7 is a block diagram of a data alignment circuit including the clock control circuit of FIG. 5 in accordance with an embodiment of the present invention.

FIG. 7 is a view of a data alignment circuit including the clock control circuit of FIG. 5 in accordance with an embodiment of the present invention.

Referring to FIG. 7, the data alignment circuit includes a clock control circuit 740 and a data alignment unit 710. The clock control circuit 740 receives a rising strobe signal DQSR and a falling strobe signal DQSF, and outputs an adjusted rising strobe signal DQSR_PW and an adjusted falling strobe signal DQSF_PW. The adjusted rising strobe signal DQS- R_PW and the adjusted falling strobe signal DQSF_PW respectively have the same logical values as the rising strobe signal DQSR and the falling strobe signal DQSF, and are obtained by controlling the rising strobe signal DQSR and the falling strobe signal DQSF such that enable pulse widths thereof do not overlap each other. The data alignment unit 710 receives data DIN in series, and aligns the data DIN in parallel and in synchronization with the adjusted rising strobe signal DQSR_PW and the adjusted rising strobe signal DQSF_PW.

The data aligned through the data alignment unit 710 are written to global input/output (I/O) lines GIO_00 to GIO_07 by I/O sensor amplifiers (IOSA) 731 to 738, respectively.

The clock control circuit 740 is identical to the clock control circuit illustrated in FIG. 5. Thus, the clock control circuit 740 may include the first clock control unit 510 of FIG. 5 and the second clock control unit 520 of FIG. 5. Alternatively, the clock control circuit 740 may include only one of the first clock control unit 510 of FIG. 5 and the second clock control unit 520 of FIG. 5.

A conventional data alignment circuit illustrated in FIG. 1 may be used as the data alignment unit 710. The data alignment unit 710 may include D flip-flops 711, 713, 718, 719, 720 and 721, and D-latches 712, 714, 715, 716 and 717 for aligning data in synchronization with the adjusted rising strobe signal DQSR_PW and the adjusted falling strobe signal DQSF_PW. Since the operation of the data alignment unit 710 has been described above, further description thereof will be omitted.

As shown in FIG. 4, the conventional data alignment circuit has limitations in that defective data alignment occurring because data are not accurately shifted in D-latches when the rising strobe signal DQSR and the falling strobe signal DQSF change in pulse width, causing the enable pulse widths thereof to overlap each other.

However, the data alignment circuit in accordance with an embodiment of the present invention includes the clock control circuit 740 that prevents the enable pulse widths of the rising strobe signal DQSR and the falling strobe signal DQSF from overlapping each other. For this reason, the data alignment circuit in accordance with an embodiment of the present invention can accurately align data without defective operation.

In accordance with an embodiment of the present invention, the clock control circuit controls such that enable pulse widths of a rising strobe signal or a first clock and a falling strobe signal or a second clock do not overlap each other. Accordingly, it prevents defective operation that may occur when operation timings of circuits operating according to the rising strobe signal and the falling strobe signal become different.

Particularly, if the clock control circuit is used for the data alignment circuit, the operation of the data alignment circuit is performed accurately without, for example, defective data latch or defective data shifting.

The present invention has been described fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, it will be understood by those skilled in the art that a clock control circuit of the present invention is applicable in controlling pulse widths of a variety of clocks used in a variety of semiconductor devices.

While the present invention has been described with respect to the specific embodiments, it will be apparent to those skilled in the art that various changes and modifications may be made without departing from the spirit and scope of the invention as defined in the following claims.

What is claimed is:

1. A clock control circuit, comprising:
a first clock control unit configured to receive a rising strobe signal and a falling strobe signal and output an adjusted rising strobe signal, an enable pulse width of which does not overlap an enable pulse width of the falling strobe signal,
wherein the first clock control unit enables the adjusted rising strobe signal when the rising strobe signal is enabled and the falling strobe signal is disabled.

2. The clock control circuit as recited in claim 1, further comprising:
a second clock control unit configured to receive the rising strobe signal and the falling strobe signal and output an adjusted falling strobe signal, an enable pulse width of which does not overlap an enable pulse width of the rising strobe signal.

3. The clock control circuit as recited in claim 2, wherein the second clock control unit enables the adjusted falling strobe signal when the falling strobe signal is enabled and the rising strobe signal is disabled.

4. The clock control circuit as recited in claim 2, wherein the second clock control unit includes a second NAND gate configured to perform a NAND operation on the falling strobe signal and a rising strobe bar signal to output the adjusted falling strobe signal.

5. The clock control circuit as recited in claim 2, wherein the first clock control unit includes:
a first inverter configured to invert the rising strobe signal;
a second inverter configured to invert an output signal of the first inverter;
a first NAND gate configured to perform a NAND operation on a falling strobe bar signal and an output signal of the second inverter; and
a third inverter configured to invert an output signal of the first NAND gate to output the adjusted rising strobe signal.

6. The clock control circuit as recited in claim 2, wherein the second clock control unit includes:
a first inverter configured to invert the falling strobe signal;
a second inverter configured to invert an output signal of the first inverter;
a first NAND gate configured to perform a NAND operation on an inverted rising strobe signal and an output signal of the second inverter; and
a third inverter configured to invert an output signal of the first NAND gate to output the adjusted falling strobe signal.

7. The clock control circuit as recited in claim 1, wherein the first clock control unit includes a first NAND gate configured to perform a NAND operation on the rising strobe signal and a falling strobe bar signal to output the adjusted rising strobe signal.

8. A clock control circuit, comprising:
a clock control unit configured to receive a rising strobe signal and a falling strobe signal and output an adjusted falling strobe signal, an enable pulse width of which does not overlap an enable pulse width of the rising strobe signal,
wherein the clock control unit enables the adjusted falling strobe signal when the falling strobe signal is enabled and the rising strobe signal is disabled.

9. The clock control circuit as recited in claim 8, wherein the clock control unit includes a NAND gate configured to perform a NAND operation on the falling strobe signal and a rising strobe bar signal to output the adjusted falling strobe signal.

10. A data alignment circuit, comprises:
a clock control circuit configured to receive a rising strobe signal and a falling strobe signal, and output an adjusted rising strobe signal and an adjusted falling strobe signal respectively having the same logical values as the rising strobe signal and the falling strobe signal by controlling such that enable pulse widths of the adjusted rising strobe signal and the adjusted falling strobe signal do not overlap each other; and
a data alignment unit configured to receive data in series and align the data in parallel and in synchronization with the adjusted rising strobe signal and the adjusted falling strobe signal,
wherein the clock control circuit includes:
a first clock control unit configured to enable the adjusted rising strobe signal when the rising strobe signal is enabled and the falling strobe signal is disabled; and
a second clock control unit configured to enable the adjusted falling strobe signal when the falling strobe signal is enabled and the rising strobe signal is disabled.

11. The data alignment circuit as recited in claim 10, wherein the first clock control unit includes a first NAND gate configured to perform a NAND operation on the rising strobe signal and a falling strobe bar signal to output the adjusted rising strobe signal, and
the second clock control unit includes a second NAND gate configured to perform a NAND operation on the falling strobe signal and a rising strobe bar signal to output the adjusted falling strobe signal.

12. The data alignment circuit as recited in claim 10, wherein the first clock control unit includes:
a first inverter configured to invert the rising strobe signal;
a second inverter configured to invert an output signal of the first inverter;
a first NAND gate configured to perform a NAND operation on a falling strobe bar signal and an output signal of the second inverter; and
a third inverter configured to invert an output signal of the first NAND gate to output the adjusted rising strobe signal, and
the second clock control unit includes:
a fourth inverter configured to invert the falling strobe signal;
a fifth inverter configured to invert an output signal of the fourth inverter;
a second NAND gate configured to perform a NAND operation on the output signal of the first inverter and an output signal of the fifth inverter; and
a sixth inverter configured to invert an output signal of the second NAND gate to output the adjusted falling strobe signal.

13. The data alignment circuit as recited in claim 10, wherein the data alignment unit includes D flip-flops and D-latches for aligning data in synchronization with the adjusted rising strobe signal or the adjusted falling strobe signal.

14. A clock control circuit, comprising:
a first clock control unit configured to receive a first clock and a second clock serving as a reference clock for a predetermined operation and output an adjusted first clock, an enable pulse width of which does not overlap an enable pulse width of the second clock,
wherein the first clock control unit enables the adjusted first clock when the first clock is enabled and the second clock is disabled.

15. The clock control circuit as recited in claim 14, further comprising:
a second clock control unit configured to receive the first clock and the second clock and output an adjusted second clock, an enable pulse width of which does not overlap an enable pulse width of the first clock.

16. The clock control circuit of claim 15, wherein the second clock control unit enables the adjusted second clock when the second clock is enabled and the first clock is disabled.

17. The clock control circuit of claim 15, wherein the first clock control unit includes:
a first inverter configured to invert the first clock;
a second inverter configured to invert an output signal of the first inverter;
a first NAND gate configured to perform a NAND operation on a second bar clock and an output signal of the second inverter; and
a third inverter configured to invert an output signal of the first NAND gate to output the adjusted first clock, and
the second clock control unit includes:
a fourth inverter configured to invert the second clock;
a fifth inserter configured to invert an output signal of the fourth inverter;
a second NAND gate configured to perform a NAND operation on the output signal of the first inverter and an output signal of the fifth inverter; and
a sixth inverter configured to invert an output signal of the second NAND gate to output the adjusted second clock.

* * * * *